United States Patent [19]

Malhi et al.

[11] Patent Number: 5,225,697

[45] Date of Patent: Jul. 6, 1993

[54] DRAM CELL AND METHOD

[75] Inventors: Satwinder S. Malhi, Garland; Gordon P. Pollack; William F. Richardson, both of Richardson, all of Tex.

[73] Assignee: Texas Instruments, Incorporated, Dallas, Tex.

[21] Appl. No.: 859,286

[22] Filed: Mar. 26, 1992

Related U.S. Application Data

[63] Continuation of Ser. No. 243,197, Sep. 8, 1988, abandoned, which is a continuation of Ser. No. 870,469, Jun. 4, 1986, abandoned, which is a continuation-in-part of Ser. No. 655,849, Sep. 27, 1984, abandoned, which is a continuation-in-part of Ser. No. 666,715, Oct. 31, 1984, abandoned.

[51] Int. Cl.$^5$ .................. H01L 29/68; H01L 29/78; H01L 29/92
[52] U.S. Cl. .................. 257/302; 257/311; 257/305; 257/296
[58] Field of Search .............. 357/23.6, 236 G, 23.4, 357/51, 55, 71, 715, 71 P

[56] References Cited

U.S. PATENT DOCUMENTS

| | | | |
|---|---|---|---|
| 4,116,720 | 9/1978 | Vinson | 357/50 X |
| 4,364,074 | 12/1982 | Garnache et al. | 357/41 X |
| 4,397,075 | 8/1983 | Fatula, Jr. et al. | 357/14 X |
| 4,433,470 | 2/1984 | Kameyama et al. | 357/92 |
| 4,434,433 | 2/1984 | Nishizawa | 357/22 |
| 4,649,625 | 3/1987 | Lu | 357/51 X |
| 4,651,184 | 3/1987 | Malhi | 357/23.6 |
| 4,670,768 | 6/1987 | Sunami et al. | 357/42 |
| 4,672,410 | 6/1987 | Miura et al. | 357/23.6 |
| 4,673,962 | 6/1987 | Chatterjee et al. | 357/23.6 |
| 4,683,486 | 7/1987 | Chatterjee | 357/23.6 |
| 4,704,368 | 11/1987 | Goth et al. | 437/60 |

FOREIGN PATENT DOCUMENTS

| | | |
|---|---|---|
| 0167764 | 1/1986 | European Pat. Off. ........... 357/23.6 |
| 0176254 | 4/1986 | European Pat. Off. . |
| 0186875 | 7/1986 | European Pat. Off. . |
| 0198590 | 10/1986 | European Pat. Off. . |
| 58-3269 | 1/1983 | Japan . |
| 59-19366 | 1/1984 | Japan . |
| 59-82761 | 5/1984 | Japan . |
| 60-182161 | 9/1985 | Japan ................... 357/23.6 |
| 60-261165 | 12/1985 | Japan . |
| 61-36965 | 2/1986 | Japan . |

OTHER PUBLICATIONS

Kenney "V-Groove Dynamic Memory Cell," IBM Tech Disc Bull, vol. 23, No. 3, Aug. 1980, pp. 967-969.
Jambotkar, C. "Compact One-Device Dynamic RAM Cell . . . " IBM Tech. Disc. Bull, Jul. 1984, pp. 1313-1320.
Chang, T. "Vertieal FET Random-Access Memories . . . " IBM Tech. Disc. Bull., Ja. 1980, pp. 3683-3687.
Kenney, D. M. "Reduced Bit Line Compacitance in VMOS Devices" IBM Tech. Disc. Bull. Feb. 1981, pp. 4052-4053.

Primary Examiner—Andrew J. James
Assistant Examiner—Sara W. Crane
Attorney, Agent, or Firm—Douglas A. Sorensen; Ronald O. Neerings; Richard B. Havill

[57] ABSTRACT

A dRAM cell and array of cells, together with a method of fabrication, are disclosed wherein the cell includes one field effect transistor and one storage capacitor with both the transistor and the capacitor formed in a trench in a substrate. The transistor source, channel and drain and one capacitor plate are formed essentially vertically in the bulk substrate sidewalls of the trench, and the gate and other capacitor plate are formed in two regions of material inserted into the trench and isolated from the bulk by an insulating layer. Signal charge is stored on the capacitor material inserted into the trench by an electrical connection of the bulk substrate source to the capacitor material through the insulating layer. In preferred embodiments word lines on the substrate surface connect to the upper of the inserted regions which forms the gate, and bit lines on the substrate surface form the drains. The trenches and cells are formed at the crossings of bit lines and word lines; the bit lines and the word lines form perpendicular sets of parallel lines.

19 Claims, 7 Drawing Sheets

DRAM CELL AND METHOD

This application is a continuation of application Ser. No. 07/243,197 filed Sep. 8, 1988, now abandoned, which is a continuation of Ser. No. 06/870,469, filed Jun. 4, 1986, now abandoned, which is a continuation-in-part of Ser. No. 06/655,849, filed Sep. 27, 1984, now abandoned, which is a continuation-in-part of Ser. No. 06/666,715 filed Oct. 31, 1984, now abandoned.

BACKGROUND

The present invention relates to semiconductor devices, and, more particularly, to dynamic random access memories.

The development of large monolithic dynamic random access memories (dRAMs) has run into many problems, and one of the most important of these problems is that of shrinking the dRAM cell size without increasing the soft-error rate in order to pack more cells on a chip. Large dRAMs are silicon based and each cell typically includes a single MOS field effect transistor with its source connected to a storage capacitor, its drain connected to a bit line, and its gate connected to a word line; the cell operates by storing a charge on the capacitor for a logic 1 and not storing any charge for a logic 0. Traditionally the cell capacitor has been formed by an inversion layer separated from an overlying electrode by a thin oxide layer and from the substrate by a depletion layer. However, to maintain stable circuit operation the capacitance must be large enough to yield a sufficient signal to noise ratio, and this leads to large substrate area devoted to the capacitor. Further, such a MOS capacitor is vulnerable to charges generated in the substrate by alpha particles (a 5 MeV alpha particle can produce more than 200 femtocoulombs of hazardous electrons), noise injected from the substrate, pn junction leakage over the entire area of the capacitor, and sub-threshold leakage of the cell transistor. A typical stored charge in a dRAM cell is 250 fC. For a five volt power supply this requires a storage capacitor of 50 fF; and with a storage oxide thickness of 150 A, a capacitor area of about 20 square microns is needed. This imposes a lower limit on the cell size if conventional two dimensional technology is used.

One approach to solve these problems appears in Jolly et al, A Dynamic RAM Cell in Recrystallized Polysilicon, 4 IEEE Elec. Dev.Lett. 8 (1983) and forms all basic elements of the cell, including both the access transistor and the charge storage capacitor, in a layer of beam recrystallized polysilicon deposited on an oxide layer on a silicon substrate. The bit line is contained in the recrystallized polysilicon layer, and turning on the transistor causes charge to flow into the storage region, which is composed of heavily doped, recrystallized polysilicon surrounded on the top, bottom, and three sides by thermally grown oxide. The storage capability is about twice that of a conventional capacitor of the same storage area since ground electrodes both above and below are separated from the storage region in the recrystallized polysilicon by capacitor insulator oxides. In addition, the lower oxide isolates the storage region from any charge injected into the substrate either from surrounding circuitry or by alpha particles or other radiation generation soft errors. Further, thick oxide under the bit line and complete sidewall oxide isolation reduce the bit-line capacitance. However, even doubling the capacitance over the traditional design fails to sufficiently shrink the area occupied by the cell capacitor. Further, beam recrystallization disturbs underlying structures and is not a simple, established process.

A second approach to shrinking dRAM cell size relies on a capacitor with plates extending into the substrate. This capacitor, called a corrugated capacitor, is described in H. Sunami et al, A Corrugated Capacitor Cell (CCC) for Megabit Dynamic MOS Memories, IEEE IEDM Tech Digest 806 (1982); H. Sunami et al, A Corrugated Capacitor Cell (CCC) for Megabit Dynamic MOS Memories, 4 IEEE Elec. Dev. Lett. 90 (1983); and K. Itoh et al, An Experimental 1 Mb dRAM with On-Chip Voltage Limiter, 1984 IEEE ISSCC Digest of Tech Papers 282. The corrugated capacitor extends about 2.5 microns into the silicon substrate. Fabrication proceeds as follows: Trenches are formed by ordinary reactive sputter etching with $CCl_4$ gas using a CVD silicon dioxide film mask; a wet etch cleans up any dry etching damage and contaminations. After trench formation, a triple storage layer of silicon dioxide/silicon nitride/silicon dioxide is formed on the trench walls. Lastly, the trench is filled with LPCVD polysilicon. Use of the corrugated capacitor assertedly yields more than seven times the capacitance of the conventional cell, with a three micron by seven micron cell having a 60 fF storage capacitance.

A third approach to shrink the area occupied by the cell capacitor is similar to the approach described in the preceding paragraph and forms the capacitor in a trench. For example, E. Arai, Submicron MOS VLSI Process Technologies, IEEE IEDM Tech Digest 19 (1983); K. Minegishi et al, A Submicron CMOS Megabit Dynamic RAM Technology Using Doped Face Trench Capacitor Cell, IEEE IEDM Tech Digest 319 (1983); and T. Morie et al, Depletion Trench Capacitor Technology for Megabit Level MOS DRAM, 4IEEE Elec. Dev. Lett. 411 (1983) all describe a cell with a traditional design except for the capacitor which has been changed from plates parallel to the substrate to plates on the walls of a trench in the substrate. Such a trench capacitor permits large capacitance per unit area of substrate by simply using a deep trench. The capacitors described in these articles were fabricated as follows: Starting with (100) oriented, p-type, 4-5 ohm-cm resistivity silicon substrates, trench patterns with 0.4-1.0 micron width were formed by electron-beam direct writing. Trenches of 1-3 micron depth were then excavated by reactive ion etching with $CBrF_3$ at a pressure of about 14 m Torr; the trench surfaces were cleared of RIE damage by an etch in a mixture of nitric, acetic, and hydrofluoric acids. PSG was then deposited by CVD using a $PH_3/SiH_4/O_2$ gas system, the phosphorus diffused into the trench surface layers, and the PSG etched away by hydrofluoric acid. $SiO_2$ of 150-500 A was grown in dry $O_2$ or CVD $Si_3N_4$ was was deposited 500 A thick on the trench walls. Lastly, the trenches were filled with LPCVD polysilicon. The capacitance per unit area of trench sidewall was comparable to the capacitance per unit area of a traditional capacitor; consequently, deep trench capacitors can shrink cell substrate area by enhancing the storage capacitor area per unit substrate area. However, the cell transistor in these trench capacitor cells is formed in the bulk substrate adjacent to the capacitor and is not isolated as in the first approach.

The use of trenches for isolation is also well known and has been extensively studied; for example, R. Rung et al, Deep Trench Isolated CMOS Devices, IEEE IEDM Tech Digest 237 (1982); K. Cham et al, A Study of the Trench Inversion Problem in the Trench CMOS Technology, 4 IEEE Elec. Dev. Lett. 303 (1983); A. Hayasaka et al, U-Groove Isolation Technique for High Speed Bipolar VLSI's, IEEE IEDM Tech Digest 62 (1982); H. Goto et al, An Isolation Technology for High Performance Bipolar Memories-IOP-II, IEEE IEDM Tech Digest 58 (1982); T. Yamaguchi et al, High-Speed Latchup-Free 0.5-um-Channel CMOS Using Self-Aligned TiSi2 and Deep-Trench Isolation Technologies, IEEE IEDM Tech Digest 522 (1983); S. Kohyama et al, Directions in CMOS Technology, IEEE IEDM Tech Digest 151 (1983); and K. Cham et al, Characterization and Modeling of the Trench Surface Inversion Problem for the Trench Isolated CMOS Technology, IEEE IEDM Tech Digest 23 (1983). These isolation trenches are formed in a manner similar to that described for the trench and corrugated capacitors; namely, patterning (typically with oxide mask), RIE with CBrF3, CCl4, Cl2-H2, CCl4-O2, etc. excavation, thermal oxidation (plus LPCVD nitride) of the sidewalls, and filling with polysilicon.

However, the beam recrystallized cell occupies too much substrate area and the trench capacitor cells fail to isolate the transistor and capacitor storage plate from the substrate. And all of these cells do not minimize the substrate area occupied.

SUMMARY OF THE INVENTION

The present invention provides a one-transistor/one-capacitor dRAM cell structure and array in which the cell transistor is formed on the sidewalls of a substrate trench containing the cell capacitor; the word and bit lines cross over this trench. This stacking of the transistor on top of the capacitor yields a cell with minimal area on the substrate and solves a problem of dense packing of cells.

In a preferred embodiment, one capacitor plate and the transistor channel and source region are formed in the bulk sidewall of the trench and the transistor gate and the other plate of the capacitor are both formed in polysilicon in the trench but separated from each other by an oxide layer inside the trench. The signal charge is stored on the polysilicon capacitor plate by an electrical connection of the source region with the polysilicon capacitor plate, and this solves the problem of isolation from the bulk. Further, the bit lines are isolated from the bulk by a thick oxide and thereby keeps bit line capacitance to a minimum.

DESCRIPTION OF THE PREFERRED EMBODIMENTS

Figure 1A:
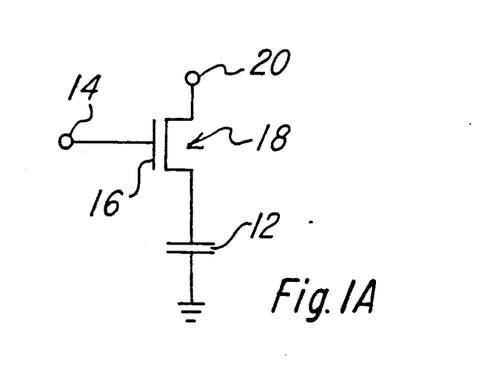
FIGS. 1A-B are the schematic equivalent circuit and local memory array geometry for preferred embodiment dRAM cells.

The preferred embodiment dRAM cells are one transistor/one capacitor cells connected to bit and word lines as shown in schematic FIG. 1A and operate as follows. Capacitor 12 stores charge to represent a bit of information (for example, no stored charge could represent a logic 0 and the stored charge corresponding to a potential of 5 volts across the capacitor plates could represent a logic 1). The bit of information is accessed (to read or to write a new bit) by applying a voltage on word line 14 connected to gate 16 to turn ON transistor 18; a turned ON transistor 18 connects capacitor 12 to bit line 20 for the read or write operation. Leakage currents and other sources of decay of the charge on capacitor 12 necessitate periodic refreshing of the charge, and thus the name dynamic RAM (dRAM).

Figure 1B:
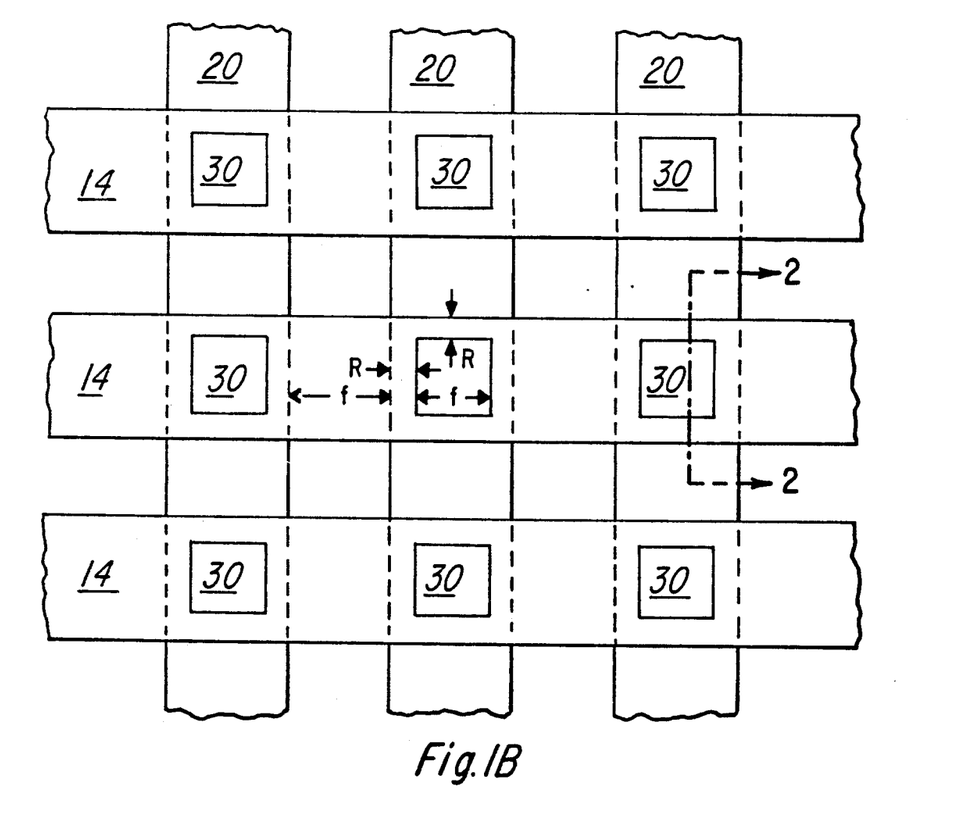

FIG. 1B is a plan view showing a portion of a dRAM array of bit lines 20 and word lines 14 with preferred embodiment cells 30 at the intersections of the lines; note that bit lines 20 pass under word lines 14. The cells extend down into the substrate below the lines and provide a maximal density memory. If the minimum feature size is denoted by f and the minimum registration is denoted by R, then the cell area is $[2(f+R)]2$. For example, with a minimum feature size of 1.0 micron and a minimum registration tolerance of 0.25 micron, the cell area is about 6.25 square microns.

Figure 2:
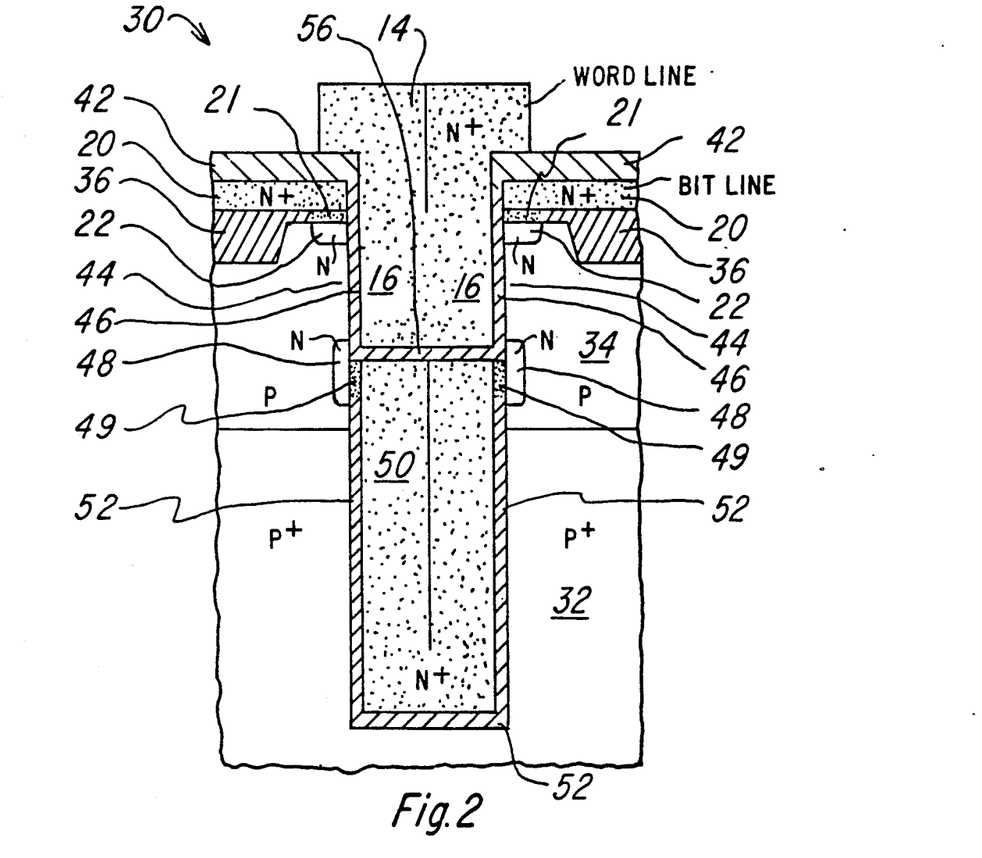
FIG. 2 is a schematic cross sectional elevation of a first preferred embodiment dRAM cell taken along line 2—2 of FIG. 1B.

FIG. 2 is a cross-sectional view of the first preferred embodiment dRAM cell, generally denoted 30. Cell 30 is formed in p+ silicon substrate 32 with p epilayer 34 and includes n+ polysilicon bit line 20, bit line insulating nitride 42, field oxide 36, n+ polysilicon word line 14, transistor 18 channel 44, transistor 18 gate oxide 46, n diffused region 48 which forms the source for transistor 18, n+ polysilicon region 50 which forms one of the plates of capacitor 12 with p+ substrate 32 forming the other and ground plate, oxide 52 which forms the insulator between the plates of capacitor 12, insulating oxide 56 which separates word line 14 from capacitor plate 50, n diffused region 22 which forms the drain of transistor 18, n polysilicon region 21 which connects bit line 20 with drain region 22, and n polysilicon region 49 which connects source 48 with n+ capacitor plate 50. Gate 16 of transistor 18 is simply that portion of word line 14 that is across gate oxide 46 from channel region 44. The view of cell 30 in FIG. 2 corresponds to a section along vertical line 2—2 in FIG. 1B; the square cross section of the trench containing capacitor 12 and transistor 18 is apparent in FIG. 1B.

In cell 30 capacitor 12 is formed with one of its plates being n+ region 50 together with n region 48 and the other plate being substrate 32 together with epilayer 34; however, the doping of epilayer 34 is much lower than that of p+ substrate 32 so the capacitance of the n/p junction of region 48 and epilayer 34 and the capacitance of n+ region 50/oxide 52/p epilayer 34 are both much less than the capacitance of n+ region 50/oxide 52/p+ substrate 32 and may be ignored. Also, as will be detailed below, the plate area of epilayer 34 is small compared to that of substrate 32, and this further makes insignificant the capacitance associated with epilayer 34. Consequently, the bulk of the charge stored by capacitor 12 is isolated from substrate 32 (and epilayer 34)

by oxide 52. For a trench with a one micron by one micron cross section and six micron depth, the capacitor 12 plate area would be about 21 square microns if one micron of the depth is epilayer 34 and bit line 20. P+ substrate 32 is the ground common to all cells 30 in an array.

Transistor 18 in cell 30 is entirely in bulk silicon with a polysilicon gate; channel region 44 is part of p epilayer 34, source region 48 (which is also a part of a plate of capacitor 12) and drain region 20 are n diffusions in p epilayer 34, gate oxide 46 is grown on the trench surface of p epilayer 34, and gate 16 is part of polysilicon word line 14. Field oxide 36 is fairly thick and minimizes the capacitance of bit line 20.

The dimensions and materials characteristic of cell 30 are best understood in connection with the following description of a first preferred embodiment method of fabrication; FIGS. 3A–G illustrate the sequence of process steps.

1. (100) oriented p+ silicon substrate 32 of resistivity less than 1E-2 ohm-cm has p epilayer 34 grown with a carrier concentration of 2E16/cm3 and thickness such that after all thermal processing the final p epilayer thickness is two microns. Field oxide 36 (including protective oxide 37) is formed by standard processing. As an example, SWAMI process may be used (grow stress relief oxide, deposit LPCVD nitride, pattern and plasma etch the nitride-oxide-silicon, boron implant for channel stops, grow second stress relief oxide, deposit second nitride, deposit LPCVD oxide, plasma etch LPCVD oxide-nitride, wet etch filaments of LPCVD oxide remaining from previous etch, thermally grow field oxide to yield an approximately planar structure, and strip the nitrides). Regardless of the method used, the final thickness of field oxide 36 is 5000 A and protective oxide 37 is about 200 A thick. 2000 A of polysilicon 20 is deposited by LPCVD, doped to a carrier concentration of 1 E20/ cm3, and patterned and etched to form bit lines 20. Next, 10,000 A of nitride 42 is deposited by LPCVD; see FIG. 3A.

2. Nitride 42 is patterned to define the one micron square trenches. The patterned nitride 42 is then used as the mask for RIE with HCL excavation of the trenches to a depth of 6 microns. The trench walls are cleaned of RIE damage and contamination with a wet acid etch; see FIG. 3B. Note that nitride 42 is also partially removed by the RIE.

3. Oxide 52 is grown to a thickness of 200 A on the trench walls and bottom. The trench is then filled with n+ doped polysilicon as part of a deposition of 7000 A of n+ polysilicon by LPCVD; see FIG. 3C.

4. Polysilicon 50 is planarized, such as with spun on photoresist, and plasma etched completely away on the surface and down into the trench to about 3000 A above the epilayer 34/substrate 32 interface; see FIG. 3D. As will be seen below, the location of the top of the remaining polysilicon 50 in the trench will approximately determine the bottom of the channel of transistor 18. Note that nitride layer 42 is further eroded by the plasma etch but is still at least 2000 A thick.

5. The exposed portion to oxide 52 is etched, and this etching is continued to overetch 1000 to 2000 A of oxide. This overetch removes the top portion of oxide 52 between epilayer 34 and polysilicon 50 to a depth of 1000 to 2000 A, as indicated by arrows 53 in FIG. 3E; and also removes 1000 to 2000 A of protective oxide 37 between epilayer 34 and bit line 20, as indicated by arrows 39 in FIG. 3E. This overetch in effect is forming two small annular crevices, each with a depth of 1000 to 2000 A and a width of 200 A; one of these small crevices girdles the top portion of polysilicon 50 as indicated by arrows 53, and the other of these small crevices runs horizontally around the boundary of bit line 20 as indicated by arrows 39.

Figure 3A:
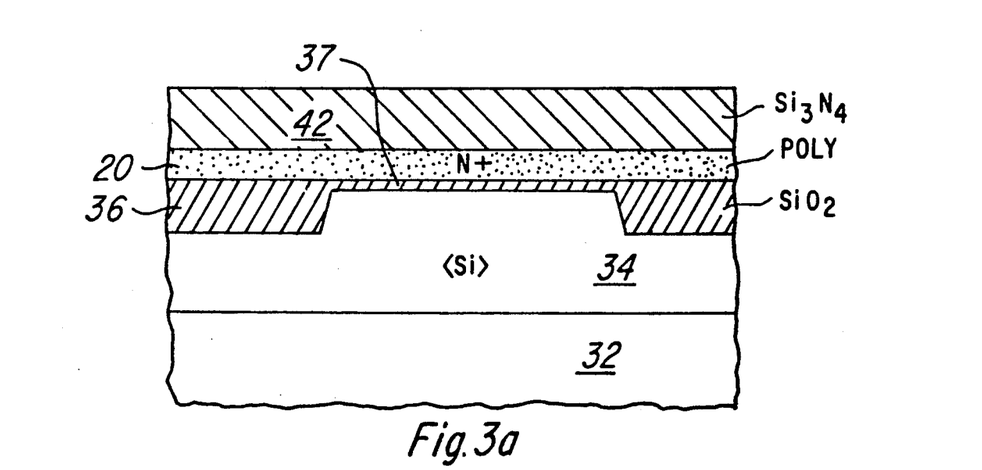
FIGS. 3A-G illustrate a sequence of process steps for fabrication of the first preferred embodiment cell by a first preferred embodiment method.
Figure 3B:
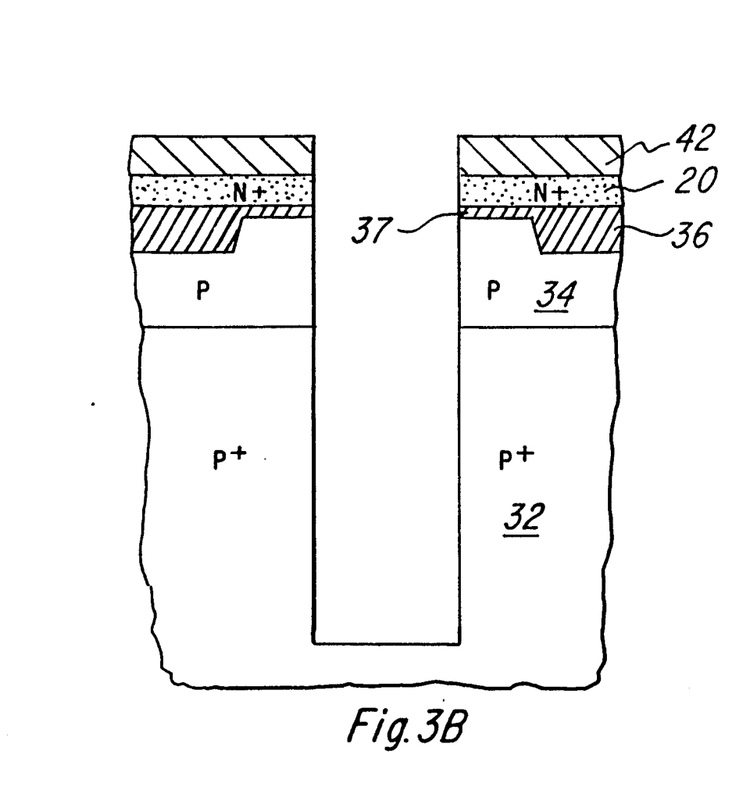
Figure 3C:
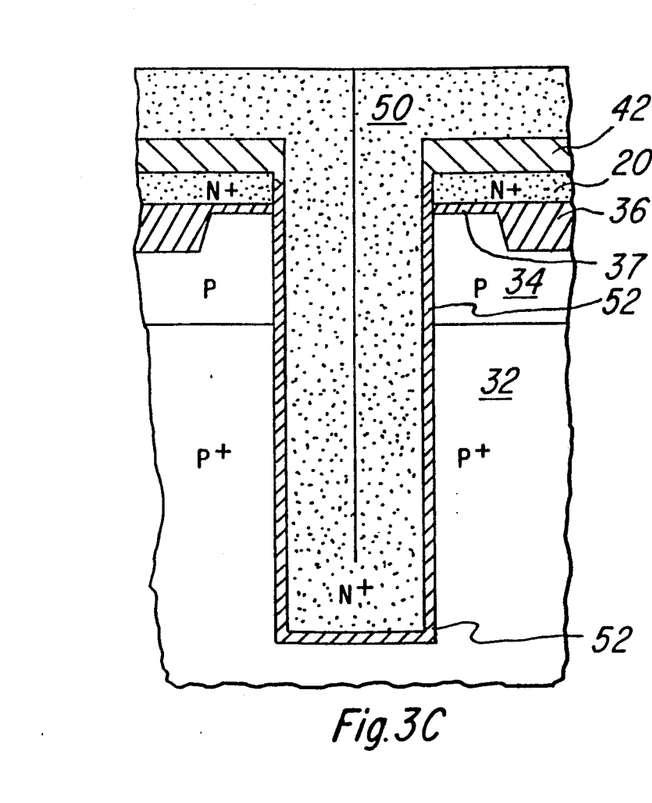
Figure 3D:
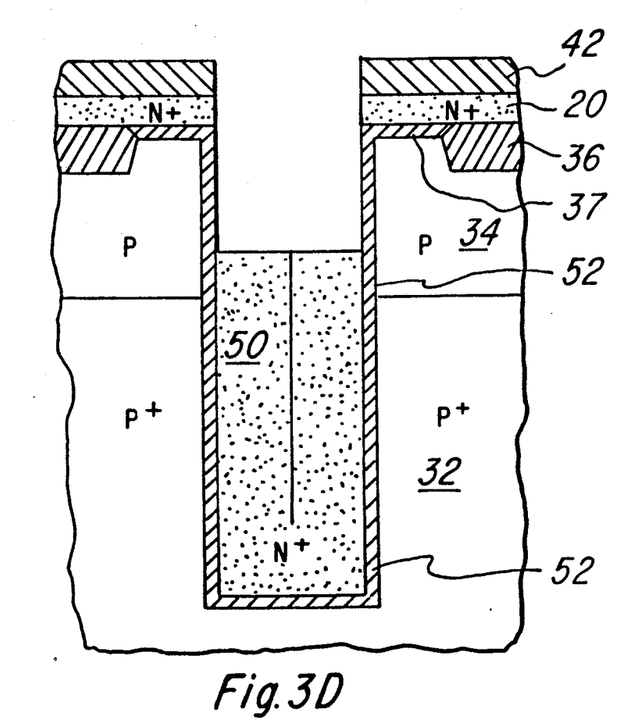
Figure 3E:
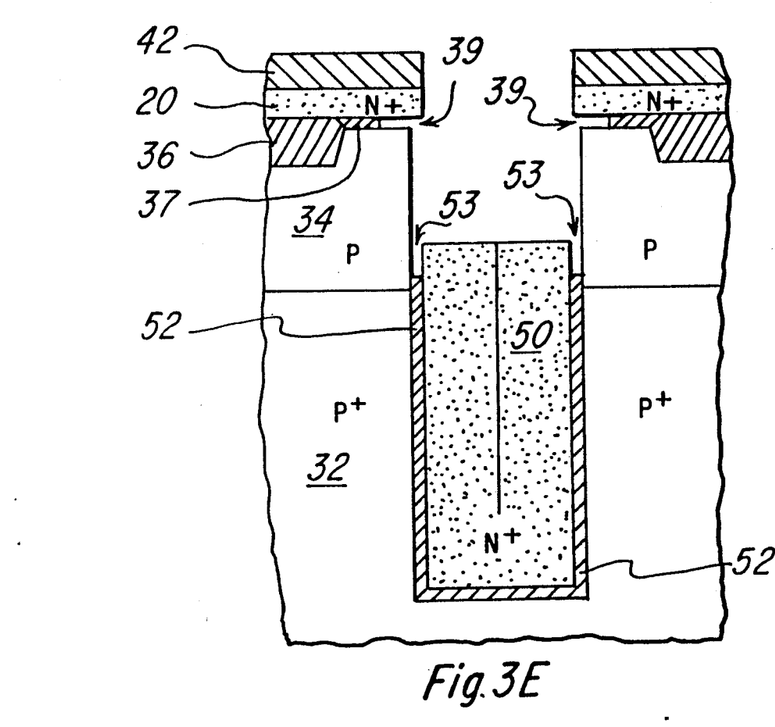
Figure 3F:
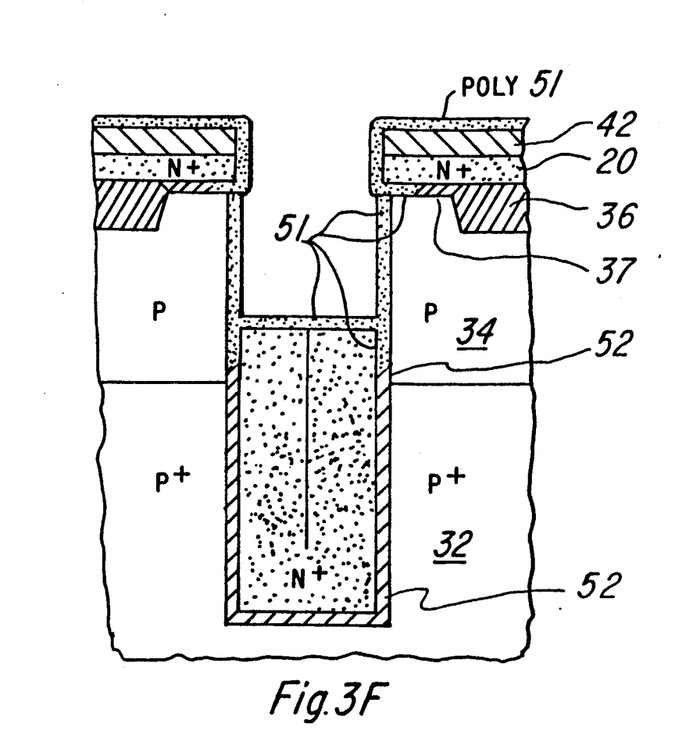
Figure 3G:
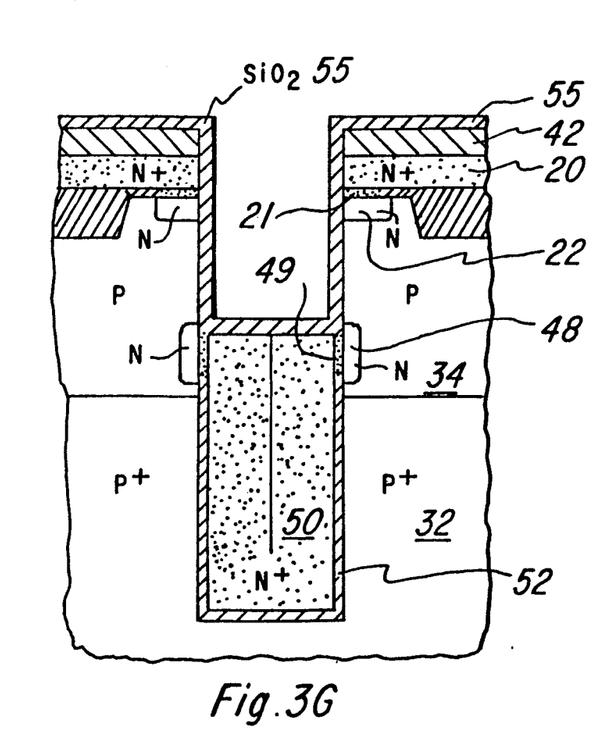

6. 200 A of polysilicon 51 is deposited by LPCVD, this is sufficient thickness to insure that the small crevices indicated by arrows 53 and 39 in FIG. 3E are filled; see FIG. 3F.

7. 500 A of oxide 55 is thermally grown, this is just enough oxidation to oxidize all of polysilicon 51 except for that portion in the small crevices indicated by arrows 53 and 39 in FIG. 3E, which are too far from the oxidizing interface. This amount of oxidation also consumes very little of epilayer 34. The high temperatures of the thermal oxidation of polysilicon 51 causes the dopant in n+ polysilicon 50 to diffuse through the polysilicon 51 in the small crevice indicated by arrows 53 and into p epilayer 34; this diffusion of dopants forms n type polysilicon region 49 and n type region 48 in p epilayer 34; see FIG. 3G. Further, a similar diffusion of dopants from bit line 20 through the polysilicon in the small crevice indicated by arrows 39 and into epilayer 34 forms n polysilicon region 21 and n type region 22 in epilayer 34; see FIG. 3G.

8. Oxide 55 is etched away, and gate oxide 46 plus insulating oxide 56 thermally grown; gate oxide 46 is grown to a thickness of 250 A, and oxide 56 is, consequently, somewhat thicker because it is simultaneously grown on n+ doped polysilicon 50. Lastly, 7000 A of n+ polysilicon is deposited by LPCVD and patterned and etched to form word lines 14. See FIG. 2 for the completed cell. Note that gate 16 (the portion of word line 14 opposite channel 44) controls all of channel 44 despite the thickness of oxide 56 because n region 48, which forms the source for transistor 18, is formed by a diffusion of dopants from polysilicon 50 through polysilicon region 49 and thus extends into epilayer 34 vertically from region 49 as well as horizontally. This vertical diffusion extends sufficiently so that gate 16 will control all of channel 44.

Figures 4, 5A, 5B, 5C, 5D:
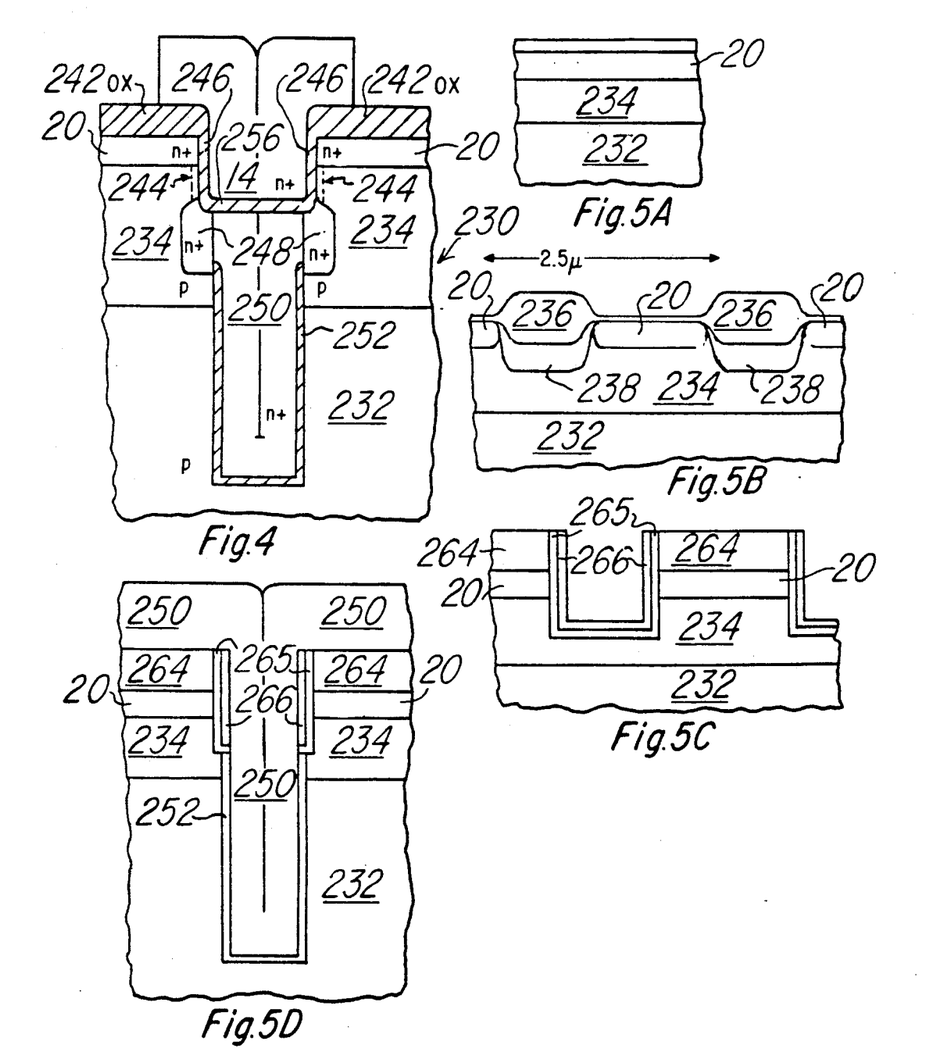
FIG. 4 is a schematic cross sectional elevation of another preferred embodiment dRAM cell taken along line 2—2 of FIG. 1B.
FIGS. 5A-G illustrate a sequence of process steps for fabrication of the first preferred embodiment cell by a first preferred embodiment method.
Figure 5E:
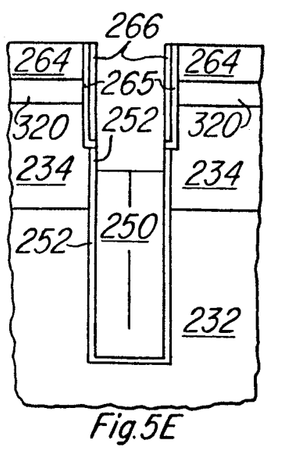
Figure 5F:
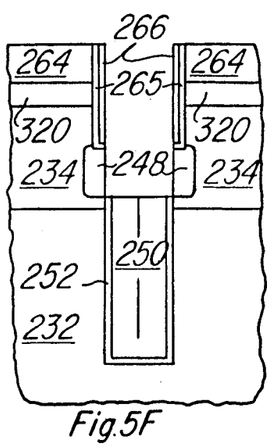
Figure 5G:
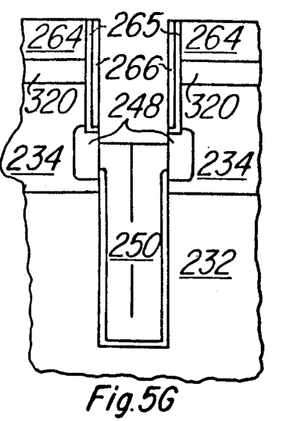

FIG. 4 is a cross sectional view of another preferred embodiment dRAM cell, generally denoted 230. Cell 230 is formed in p+ silicon substrate 232 with p epilayer 234 and includes n+ buried bit line 20, bit line insulator oxide 242, n+ polysilicon word line 214, transistor 18 channel 244, transistor 18 gate oxide 246, n+ diffused region 248 which forms the source region for transistor 18, n+ polysilicon region 250 which forms one of the plates of capacitor 12 with p+ substrate 232 forming the other and ground plate, oxide/nitride/oxide stack 252 which forms the insulator between the plates of capacitor 12, and insulating oxide 256. The view of cell 230 in FIG. 4 corresponds to a section along horizontal line 2—2 in FIG. 1B; the square cross section of the trench containing capacitor 12 and transistor 18 is apparent in FIG. 1B.

In cell 230 capacitor 12 is formed with one of its plates being n+ regions 248 and 250 and the other plate being substrate 232 plus epilayer 234; however, the doping of epilayer 234 is much lower than that of p+ substrate 232, so the capacitance of the n+/p junction of region 248 and epilayer 234 and the capacitance of n+ region 250/stack 252/p epilayer 234 are both much less than the capacitance of n+ region 250/stack 252/p+ substrate 232 and may be ignored. Also, as will be detailed below, the plate area of epilayer 234 is small compared to that of substrate 232, and this further implies the insignificance of the epilayer 234 capacitance. For a trench with a 1 micron by 1 micron cross section and 5 microns deep, the capacitor 12 plate area would be about 17 square microns if 1 micron of the depth is epilayer 234 and bit line 20. P+ substrate 232 is the ground common to all cells 230 in an array.

Transistor 18 in cell 230 is entirely in bulk silicon with a polysilicon gate: channel region 244 is part of p epilayer 234, source region 248 (which is also a part of a plate of capacitor 12) and drain region 20 (which is also bit line 20) are n+ diffusions in p epilayer 234, gate oxide 246 is grown on the trench surface of p epilayer 234, and the gate is part of polysilicon word line 214. Insulating oxide 242 is fairly thick, but gate 214 still overlaps the source and drain of transistor 18.

The dimensions and materials characteristics of cell 230 are best understood in connection with the following description of a first preferred embodiment method of fabricating cell 230; FIGS. 5A-G illustrate the sequence of process steps.

1. (100) oriented p+ silicon substrate 232 of resistivity less than 1E-2 ohm-cm has p epilayer 234 grown with a carrier concentration of 2E16 per cm3 and thickness such that after all thermal processing the final p epilayer thickness is 2.0 microns. Field oxide 236 and p channel stops 238 are formed in the usual manner: a stress relief oxide layer is grown and LPCVD nitride is deposited on the oxide; the active area (bit lines 20 plus peripheral area outside of the cell array) is patterned and plasma etching removes the nitride and oxide outside the active area; a boron implant using the nitride as a mask creates channel stops 238 to a depth of 4,000 A with a carrier concentration of 1E17 per cm3; and field oxide 236 is grown to a thickness of 8,000 A. The nitride is stripped; photolithography defines the portion of the active area to be occupied by bit lines 20, and an arsenic implant forms them to a depth of 2,000 A with a carrier concentration of 1E20 per cm3; see FIGS. 5A-B for the view after photoresist cleanup and protective oxide growth. FIG. 5A is a cross section along bit lines 20 and FIG. 5B is a cross section perpendicular to bit lines 20; note that bit lines 20 are about 1.5 microns wide as described in connection with FIG. 1B.

2. One micron of plasma enhanced CVD oxide 264 is deposited and patterned to define the 1 micron square trenches. The patterned oxide 264 is then used as the mask for RIE with HCl excavation of the trenches to a depth of 1.25 microns. The trench walls are cleaned of RIE damage and contamination with a wet acid etch, and protective oxide 265 thermally grown on the trench walls and bottom; an LPCVD deposition of nitride 266 in a sidewall process is used to protect the sidewall oxide and limit diffusion in subsequent processing; oxide 265 may be about 200 A thick and nitride 266 may be about 1,000 A thick. See FIG. 5C which is the cross section along bit lines 20 as are FIGS. 5D-H.

3. The trench is further excavated again using RIE with HCl, note that oxide 264 is also being somewhat eroded, but was initially deposited sufficiently thick to avoid problems. After the trench has been excavated to a total depth of about 5.0 microns, it is cleaned and capacitor 12 insulator stack 252 is formed by thermally growing oxide to a thickness of 100 A followed by a LPCVD deposition of nitride to a thickness of 75 A. The nitride is then thermally oxidized to improve the dielectric integrity and this yields the oxide/nitride/oxide stack 252. The trench is filled with n+ doped polysilicon 250; see FIG. 5D.

4. Polysilicon 250 is planarized, such as with spun on photoresist, and plasma etched completely away on the surface and down into the trench to 3,000 A below the upper level of insulator stack 252 but above substrate 232. As will be seen below, the location of the top of polysilicon 250 is not crucial provided that it lies somewhat below the top of stack 252 and above substrate 232. See FIG. 5E.

5. The exposed portion of stack 252 is stripped (recall nitride 266 is much thicker than stack 252, so the exposed portion of stack 252 may be stripped without removing much of nitride 266), and a phosphorous vapor phase diffusion used to form n+ regions 248 with a thickness of at least 2,000 A; see FIG. 5F. Note that in FIG. 5F there appear to be two regions 248, but actually they are just part of a single annular region that girdles the trench and forms the source for transistor 18. The gate oxide for transistor 18 has not yet been formed.

6. N+ polysilicon is deposited by LPCVD and planarized and plasma etched completely away on the surface and down into the trench to just below the oxide 265 and nitride 266. Note that this polysilicon just adds to polysilicon 250 and is denoted by the same reference number; see FIG. 5G. Note that again the location of the top of polysilicon 250 is not crucial provided that sufficient overlap of polysilicon 250 with region 248 exists for good electrical contact and that all of oxide 265 and nitride 266 are exposed which will insure that the gate of transistor 18 covers all of the channel, as described below.

7. Thermal oxide 256 is grown on the exposed portions of polysilicon 250 and regions 248 to a thickness of about 1,000 A; nitride 266 prevents oxide 265 from growing except for a bird's beak at the lower edge. Oxide 256 is grown to help lower the gate to source parasitic capacitance of transistor 18 and could be omitted. Next nitride 266 is etched and then oxide 265 (and a portion of the much thicker oxide 256) is wet etched away, exposing channel region 244 and a small part of region 248. Gate oxide 246 is grown on channel region 244 to a thickness of 250 A (this also increases the thickness of oxide 256) and n+ polysilicon 214 is deposited and patterned to form word lines 214. See FIG. 4 for the completed cell.

Another preferred embodiment dRAM cell, generally denoted 330, and second preferred method of fabrication are illustrated in FIGS. 6 in cross sectional elevation views analogous to those of FIGS. 4 and 5A-G. The processing steps are as follows.

1. (100) oriented p+ silicon substrate 332 has 1,000 A of thermal oxide 335 grown and 1 micron of plasma enhanced CVD oxide 337 deposited. Oxide 337 is patterned to define the 1 micron square trenches and then used as the mask for RIE with HCl excavation of the trenches to a depth of 5 microns. The trench walls are cleaned and capacitor oxide 352 thermally grown on the trench sidewalls and bottom to a thickness of 150 A. Next, 4 microns of arsenic doped n+ polysilicon 350 is sputter deposited; see FIG. 6A.

2. The oxides are wet etched, this removes the exposed portion of capacitor oxide 352 and lifts off the portion of polysilicon 350 on oxide 337. 2,000 A thick layer of 1–2 ohm-cm silicon epilayer 344 is deposited and implanted to form layer 320 which will become n+ bit lines 20 and the drain of transistor 18 plus region 348 which will become the source of transistor 18; see FIG. 6B. Of course, region 348 is expected to have various faults since it is deposited over polysilicon 350, but this is not significant because the undoped portion of epilayer 344 will become the channel of transistor 18.
3. An anneal causes the implanted donors to diffuse and thereby make region 348 bulge slightly. Gate oxide 346 is thermally grown to a thickness of 250 A, and n+ polysilicon 14 is deposited and patterned and etched to form word lines 14. See FIG. 6C for the completed cell.

Figure 6A:
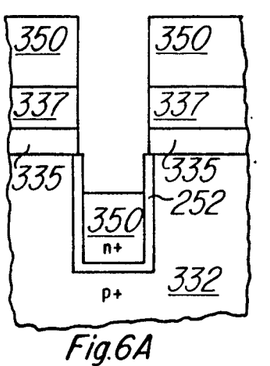
FIGS. 6A-E illustrate other preferred embodiment cells and second and third preferred embodiment methods of fabrication.
Figure 6B:
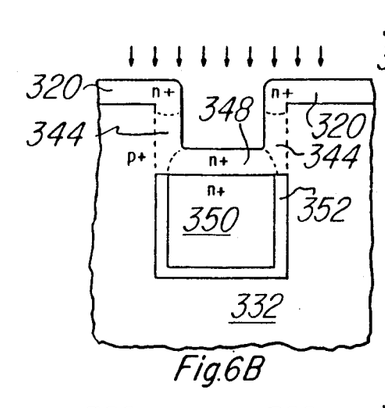
Figure 6C:
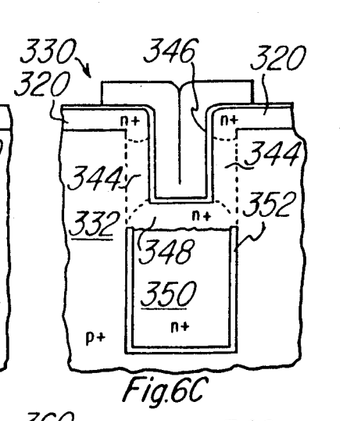
Figure 6D:
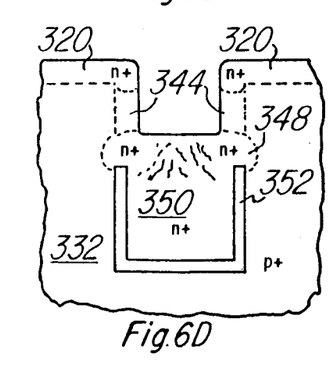

Another preferred embodiment cell, generally denoted 360, is a variation of cell 330 and fabricated by a third preferred embodiment method which is a variation of the second preferred method, as follows, with the same reference numbers used for corresponding features:
1. Follow step 1 and the oxide etch of step 2.
2. 2,000 A thick layer of LPCVD polysilicon 344 is deposited and implanted to form layers n+ layers 320 and 348; FIG. 6B describes this provided it is understood that regions 320, 344, and 348 are polysilicon and not epilayer as with the second preferred embodiment.
3. Annealing and solid phase epitaxy convert regions 320 and 344 into epilayers on substrate 332. And, a portion of regions 348 and 350 is also converted to single crystal; the wavy lines in FIG. 6D suggest this partial crystallization. Note that only the crystallization of region 344 (the channel of transistor 18) significantly affects performance. The high temperatures used in this processing causes some of the donor implants to diffuse, and thus regions 348 bulge out, as shown in FIG. 6D. Layer 320 is patterned and etched to form bit lines 20.
4. Gate oxide 346 is thermally grown to a thickness of 250 A, and n+ polysilicon 14 is deposited and patterned and etched to form word lines 14. See FIG. 6E for the completed cell 360.

Figure 6E:
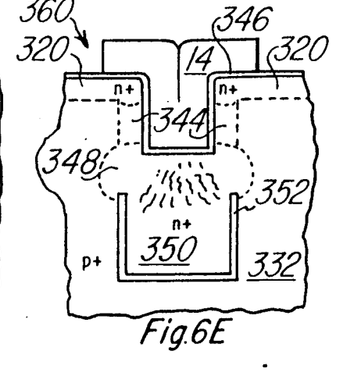

Cells 330 and 360 operate in the same manner as cell 30: transistor 18 is oriented vertically with drain 20, channel 344, source 348, and gate 14; and capacitor 12 has n+ region 348–350 as one plate, p+ substrate 332 as the other plate, and oxide layer 352 plus the reversed biased junction between region 348 and substrate 332 as the dielectric.

A variation in step 3 of the fabrication of cell 360 patterns and etches layer 320 after the solid phase epitaxy to define and implant the channel stops between the bit lines 20; see FIG. 5B for the fabrication of channel stops 38 between bit lines 20 in the first preferred embodiment method of fabrication.

Modifications of the preferred embodiment cells or preferred embodiment methods of fabrication such as varying the dimensions, the shape of the trenches, doping levels, substitutional materials, diffusions in lieu of implantations, wet instead of dry etching, various halocarbons for RIE, omitting protective nitride 66, and so forth are immediate.

Many modifications of the preferred embodiments are available which still fall within the scope of the invention in that such modifications, either singly or in combinations, do not disrupt the storage of signal charge by the capacitor nor the on/off function of the transistor. Such modifications include the following:

The trench cross section could be whatever shape is convenient, such as circular, rectangular, arbitrary convex, corrugated, even multiconnected and could even vary along the vertical, continuously or in steps or both. Similarly, the trench sidewalls, need not be vertical, rather any geometry that can be processed should work to a greater or lesser extent, such as bulging, tapered, and sloped sidewalls; indeed, any simply connected trench is homeomorphic to the parallelepiped of the preferred embodiment. Lastly, the dimensions of the trench (depth, cross sectional area, diameter, and so forth) may be varied but in practice are a tradeoff of process convenience, capacitance required, substrate area, and so forth. Of course, the capacitance required depends upon the refresh time, transistor leakage current, supply voltage, soft error immunity, capacitor leakage current, et cetera.

The capacitor insulator can be of any convenient material such as oxide, nitride, oxide-nitride, oxide-nitride-oxide, and other stack combinations, and the oxide could be thermally grown, LPCVD, grown dry or in steam, and so forth. The thickness of the insulator is a tradeoff of process convenience, insulator reliability, dielectric constant, breakdown voltage, and so forth and may vary widely. Of course, if the cell and array are fabricated in semiconductor material other than silicon (such as gallium arsenide, aluminum gallium arsenide, mercury cadmium telluride, germanium, indium phosphide, and so forth), the capacitor insulator will be a corresponding material. Also, for the capacitor formed by a reverse biased junction, the doping profiles may be varied, the choice will be a tradeoff of process convenience, cell size, capacitor performance, and so forth. Similarly, amorphous silicon could be used in place of polysilicon, and the etch back to form the crevices may be wet or dry (plasma).

The transistor can be formed to operate with a variety of threshold voltages by adjusting the threshold voltage (such as by a shallow diffusion on the channel just prior to gate oxide growth or deposition). The doping levels and the doping species can be varied so as to vary the transistor characteristics; note that the transistor channel length is determined approximately by trench depth and channel width is roughly equal to the trench perimeter and that n-channel and p-channel devices require oppositely doped regions. The transistor gate may be polysilicon, metal, silicide, and so forth. All of these variations affect performance of the transistor but are acceptable if the transistor adequately performs as a pass transistor for the cell in view of the other characteristics of the cell including required read and write times, the capacitance, the refresh time, and so forth.

We claim:
1. A memory cell comprising:
a substrate having a trench formed therein;
a capacitor having a first capacitor plate formed substantially in a first portion of said trench, said first portion of said trench being disposed away from the mouth of said trench relative to a second portion of said trench, and said substrate serving as a second capacitor plate, said first and second capacitor plates separated by an insulating material; and a transistor comprising: a source region formed in said substrate and encircling said trench in a plane substantially perpendicular to the major axis of said trench and directly connected to said first capacitor plate, a drain region formed in said substrate and encircling said trench in a plane substantially perpendicular to the major axis of said trench and a gate formed in said second portion of said trench.

2. A memory cell as in claim 1 wherein said first capacitor plate comprises polycrystalline silicon.

3. A memory cell as in claim 1 wherein said first capacitor plate is in physical contact with said source region.

4. A memory array comprising:
a substrate having a plurality of trenches formed therein;
a plurality of memory cells, each memory cell comprising:
a capacitor having a first capacitor plate formed substantially in a first portion of one of said trenches, said first portion of said trench being disposed away from the mouth of said trench relative to a second portion of said trench, and said substrate serving as a second capacitor plate, said first and second capacitor plates separated by an insulating material; and
a transistor comprising: a source region formed in said substrate and encircling said trench in a plane substantially perpendicular to the major axis of said trench and directly connected to said first capacitor plate, a drain region formed in said substrate and encircling said trench in a plane substantially perpendicular to the major axis of said trench and a gate formed in said second portion of said trench.

5. A memory array as in claim 4 wherein said first capacitor plate comprises polycrystalline silicon.

6. A memory array as in claim 4 wherein said first capacitor plate is in physical contact with said source region.

7. A memory cell as in claim 2 including a conductor connected to said first capacitor plate and said source region and passing through said insulating layer.

8. A memory cell as in claim 5 including a conductor connected to said first capacitor plate and said source region and passing through said insulating layer.

9. A device comprising:
(a) a substrate with a trench formed therein;
(b) a capacitor plate within said trench substantially insulated from said substrate; and
(c) a field effect transistor having a channel positioned to provide current substantially along the walls of said trench to said plate.

10. Device as in claim 9 wherein said channel surrounds the upper portion of said trench.

11. Device as in claim 9 wherein said channel is disposed in said substrate.

12. Device as in claim 9 wherein a substantial region of said substrate surrounding the isolated portion of said capacitor is a type from the group of N+ and P−.

13. A device comprising:
(a) a layer of semiconductor material of first conductivity type having at least a wall;
(b) a conductor spaced from said wall by an insulator;
(c) a doped region of a second conductivity type between said insulator and said layer of semiconductor material; and
(d) a conductive material connecting said conductor to said doped region, a first portion of said wall is the channel of a transistor and said conductor is one plate of a capacitor and a second portion of said wall opposite said conductor is another plate of said capacitor.

14. Device as in claim 13 wherein said wall forms a part of a trench.

15. Device as in claim 13 wherein said conductive material is in contact with said conductor.

16. Device as in claim 13 wherein said layer of semiconductor material includes a substrate and a layer of epitaxial material and said wall extends through at least part of said layer of epitaxial material.

17. Device as in claim 13 wherein said conductor is one plate of a capacitor.

18. Device as in claim 13 wherein said conductive material is between said wall and said conductor.

19. A device comprising:
(a) a layer of semiconductor material of a first conductivity type having at least first and second surfaces and a wall, said wall extending between and at an angel to said first and second surfaces, said first surface being spaced from said second surface;
(b) a conductor spaced from said wall by an insulator;
(c) a doped region of a second conductivity type between said insulator and said layer of semiconductor material; and
(d) a conductive material connecting said conductor to said doped region, a first portion of said wall is the channel of a transistor and said conductor is one plate of a capacitor and a second portion of said wall opposite said conductor is another plate of said capacitor.

* * * * *